(12) United States Patent
Tsao

(10) Patent No.: US 11,094,594 B2
(45) Date of Patent: Aug. 17, 2021

(54) SEMICONDUCTOR STRUCTURE WITH BURIED POWER RAIL, INTEGRATED CIRCUIT AND METHOD FOR MANUFACTURING THE SEMICONDUCTOR STRUCTURE

(71) Applicant: MEDIATEK INC., Hsin-Chu (TW)

(72) Inventor: Po-Chao Tsao, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/059,196

(22) Filed: Aug. 9, 2018

(65) Prior Publication Data

US 2019/0080969 A1  Mar. 14, 2019

Related U.S. Application Data

(60) Provisional application No. 62/557,204, filed on Sep. 12, 2017.

(51) Int. Cl.
*H01L 21/8234* (2006.01)
*H01L 21/74* (2006.01)
(Continued)

(52) U.S. Cl.
CPC .... *H01L 21/823481* (2013.01); *H01L 21/743* (2013.01); *H01L 21/76224* (2013.01); *H01L 21/76877* (2013.01); *H01L 21/76895* (2013.01); *H01L 21/76897* (2013.01); *H01L 21/823418* (2013.01); *H01L 21/823475* (2013.01); *H01L 21/823493* (2013.01); *H01L 21/823821* (2013.01); *H01L 21/823871* (2013.01); *H01L 23/5286* (2013.01); *H01L 27/0924* (2013.01);
(Continued)

(58) Field of Classification Search
CPC ..... H01L 21/823841; H01L 21/823418; H01L 21/823431; H01L 23/5286; H01L 27/0924; H01L 27/0207; H01L 29/41791; H01L 27/0886
See application file for complete search history.

(56) References Cited

U.S. PATENT DOCUMENTS

2003/0207523 A1  11/2003  Liu et al.
2012/0280287 A1  11/2012  Hou et al.
(Continued)

FOREIGN PATENT DOCUMENTS

EP  3 324 436 A1  5/2018

*Primary Examiner* — Samuel A Gebremariam
*Assistant Examiner* — Jonas T Beardsley
(74) *Attorney, Agent, or Firm* — Wolf, Greenfield & Sacks, P.C.

(57) ABSTRACT

A semiconductor structure is provided. The semiconductor structure includes a shallow trench isolation (STI) region on a well region of a substrate, a plurality of transistors, and a power rail. Each of the transistors includes at least one fin, a gate electrode formed on the fin, and a doping region formed on the fin. The fin is formed on the well region, and is extending in a first direction. The gate electrode is extending in a second direction that is perpendicular to the first direction. The power rail is formed in the STI region and below the doping regions of the transistors, and extending in the first direction. Each of the doping regions is electrically connected to the power rail, so as to form a source region of the respective transistor. The power rail is electrically connected to the well region of the substrate.

17 Claims, 14 Drawing Sheets

(51) Int. Cl.
    *H01L 21/768*     (2006.01)
    *H01L 29/78*     (2006.01)
    *H01L 21/8238*     (2006.01)
    *H01L 23/528*     (2006.01)
    *H01L 27/092*     (2006.01)
    *H01L 21/762*     (2006.01)
    *H01L 29/66*     (2006.01)

(52) U.S. Cl.
    CPC ...... *H01L 29/6681* (2013.01); *H01L 29/7853* (2013.01); *H01L 21/823878* (2013.01)

(56) References Cited

U.S. PATENT DOCUMENTS

| | | | |
|---|---|---|---|
| 2015/0318215 A1 | 11/2015 | Taylor, Jr. et al. | |
| 2016/0049395 A1* | 2/2016 | Okagaki | H01L 27/0207 257/401 |
| 2018/0145030 A1* | 5/2018 | Beyne | H01L 21/76251 |
| 2018/0151494 A1* | 5/2018 | Ohtou | H01L 21/823814 |

\* cited by examiner

__US 11,094,594 B2__

SEMICONDUCTOR STRUCTURE WITH BURIED POWER RAIL, INTEGRATED CIRCUIT AND METHOD FOR MANUFACTURING THE SEMICONDUCTOR STRUCTURE

CROSS REFERENCE TO RELATED APPLICATIONS

This Application claims priority of U.S. Provisional Application No. 62/557,204, filed on Sep. 12, 2017, the entirety of which is incorporated by reference herein.

BACKGROUND OF THE INVENTION

Field of the Invention

The invention relates to a power rail, and more particularly to a power rail embedded in shallow trench isolation (STI) region.

Description of the Related Art

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node.

With the increased demands for miniaturization, higher speed, greater bandwidth, lower power consumption, and lower latency, chip layout has become more complicated and difficult to achieve in the production of semiconductor dies. For example, the routing area has decreased.

BRIEF SUMMARY OF THE INVENTION

A semiconductor structure, an integrated circuit (IC) and a method for manufacturing a semiconductor structure are provided. An embodiment of a semiconductor structure is provided. The semiconductor structure comprises a shallow trench isolation (STI) region on a well region of a substrate, a plurality of transistors, and a power rail. Each of the transistors comprises at least one fin, a gate electrode formed on the fin, and a doping region formed on the fin. The fin is formed on the well region, and is extending in a first direction. The gate electrode is extending in a second direction that is perpendicular to the first direction. The power rail is formed in the STI region and below the doping regions of the transistors, and extending in the first direction. Each of the doping regions is electrically connected to the power rail, so as to form a source region of the respective transistor. The power rail is electrically connected to the well region of the substrate.

Furthermore, an embodiment of an integrated circuit is provided. The integrated circuit comprises a substrate, an N-type well region on the substrate, a P-type well region on the substrate, a shallow trench isolation (STI) region on the P-type well region and the N-type well region, an interlayer dielectric (ILD) layer over the STI region, a plurality of cells, a VDD line and a VSS line. Each of the cells comprises at least one PMOS transistor formed over the N-type well region, and at least one NMOS transistor formed over the P-type well region. The PMOS transistor is separated from the NMOS transistor by the STI region and the LID layer. The VDD line is formed in the STI region over the N-type well region and under the LID layer, and is electrically connected to a source region of the PMOS transistor. The VSS line is formed in the STI region over the P-type well region and under the LID layer, and is electrically connected to a source region of the PMOS transistor.

Moreover, an embodiment of the method for manufacturing a semiconductor structure is provided. A substrate is provided. At least one fin and at least one dummy fin are formed over a well region on the substrate, wherein the fin and the dummy fin are parallel with a first direction, and the dummy fin is wider than the fin. A shallow trench isolation (STI) region is formed over the substrate, wherein the fin and the dummy fin are separated from each other by the STI. The dummy fin is removed to form a trench in the STI region. The trench is used to form a power rail over the well region.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

FIGS. 1A-1E show block diagrams of a layout of features of a semiconductor structure 100 comprising one or more cells in an integrated circuit (IC) according to an embodiment of the invention. FIGS. 1A through 1E illustrate features in different levels of the cells, which are consecutively described for clarity. In some embodiments, the cells may be the standard cells or the memory cells (e.g., SRAM cells) in the IC.

Figure 1A:
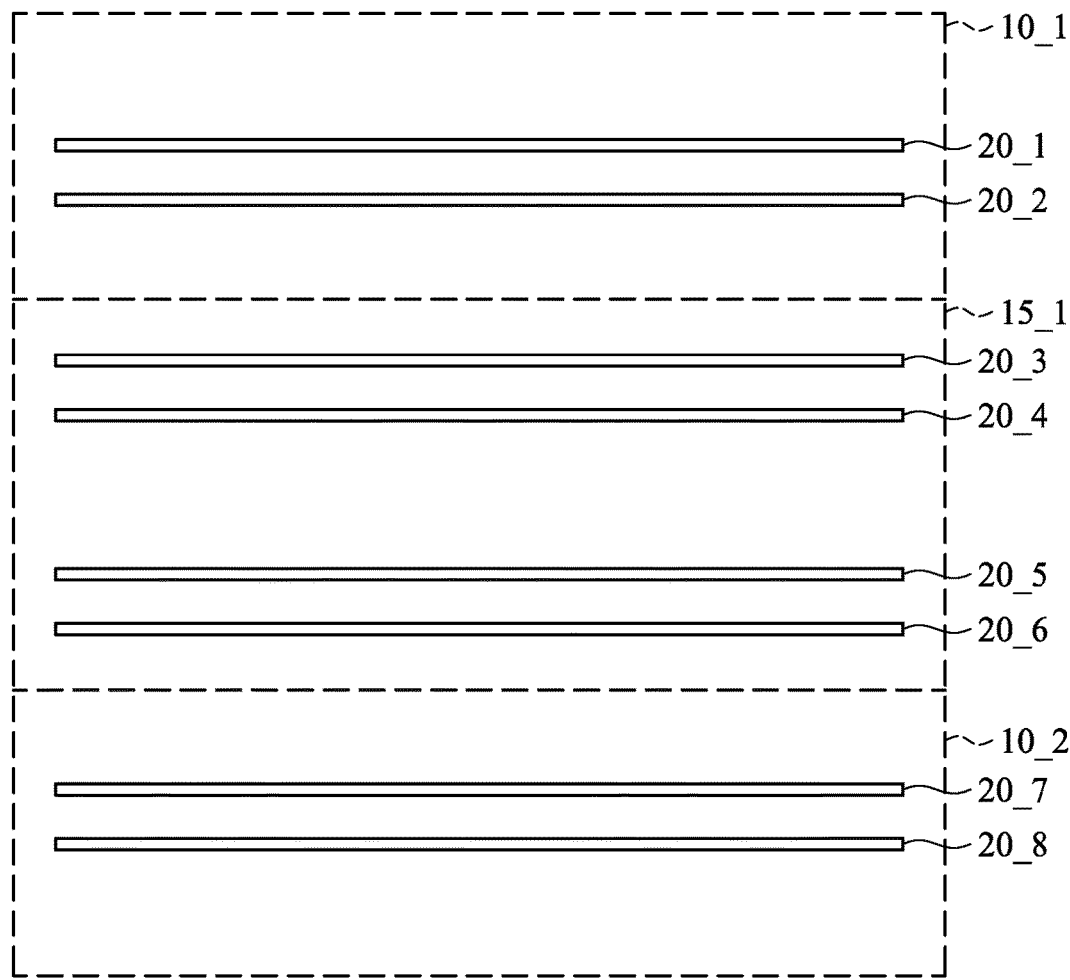
FIGS. 1A-1E show block diagrams of a layout of features of a semiconductor structure comprising one or more cells in an integrated circuit (IC) according to an embodiment of the invention.
Figure 1A:
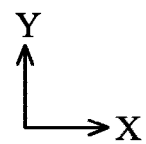

In FIG. 1A, a P-type well region 15_1 is disposed at the middle of semiconductor structure 100, and two N-type well regions 10_1 and 10_2 are on opposite sides of P-type well region 15_1. The fins 20_1 and 20_2 are formed on the N-type well region 10_1, the fins 20_3 through 20_6 are formed on the P-type well region 15_1, and the fins 20_7 and 20_8 are formed on the N-type well region 10_2. The fins 20_1 through 20_8 are parallel with the X-direction.

Figure 1B:
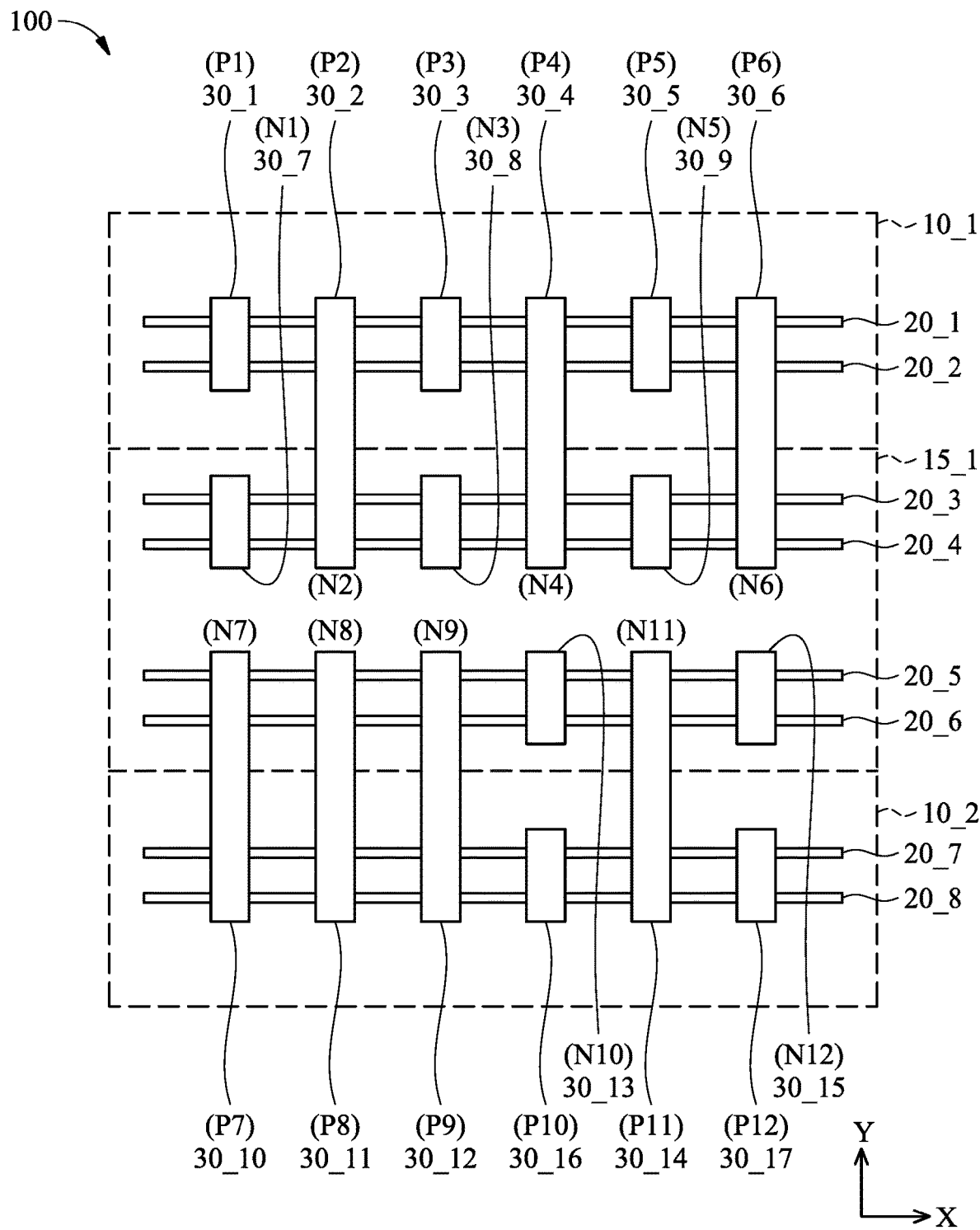

In FIG. 1B, the gate electrodes 30_1 through 30_17 are arranged parallel with the Y-direction, and the Y-direction is perpendicular to the X-direction. The gate electrodes 30_1 through 30_6 form a plurality of PMOS transistors P1 through P6 with the underlying fins 20_1 and 20_2 over the N-type well region 10_1. Furthermore, the gate electrodes 30_2, 30_4 and 30_7 through 30_9 form a plurality of NMOS transistors N1 through N6 with the underlying fins 20_3 and 20_4 over the P-type well region 15_1, and the gate electrodes 30_10 through 30_15 form a plurality of NMOS transistors N7 through N12 with the underlying fins 20_5 and 20_6 over the P-type well region 15_1. Moreover, the gate electrodes 30_10 through 30_12, 30_14, 30_16 and 30_17 form a plurality of PMOS transistors P7 through P12 with the underlying fins 20_7 and 20_8 over the N-type well region 10_2. In the embodiment, the PMOS transistors P1 through P12 and the NMOS transistor N1 through N12 are the dual-fin field effect transistors (FETs). In some embodiments, the PMOS transistors P1 through P12 and the NMOS transistor N1 through N12 are single-fin FETs. In some embodiments, the number of fins under the gate electrodes 30_1 through 30_17 may be the same or different. Furthermore, each gate electrode is capable of connecting to an overlying level through the respective gate contact (also referred to as contact plug) in the IC.

In FIG. 1B, the gate electrode 30_2 is shared by the PMOS transistor P2 and the NMOS transistor N2. The gate electrode 30_4 is shared by the PMOS transistor P4 and the NMOS transistor N4. The gate electrode 30_6 is shared by the PMOS transistor P6 and the NMOS transistor N6. The gate electrode 30_10 is shared by the PMOS transistor P7 and the NMOS transistor N7. The gate electrode 30_11 is shared by the PMOS transistor P8 and the NMOS transistor N8. The gate electrode 30_12 is shared by the PMOS transistor P9 and the NMOS transistor N9. The gate electrode 30_14 is shared by the PMOS transistor P11 and the NMOS transistor N11.

Figure 1C:
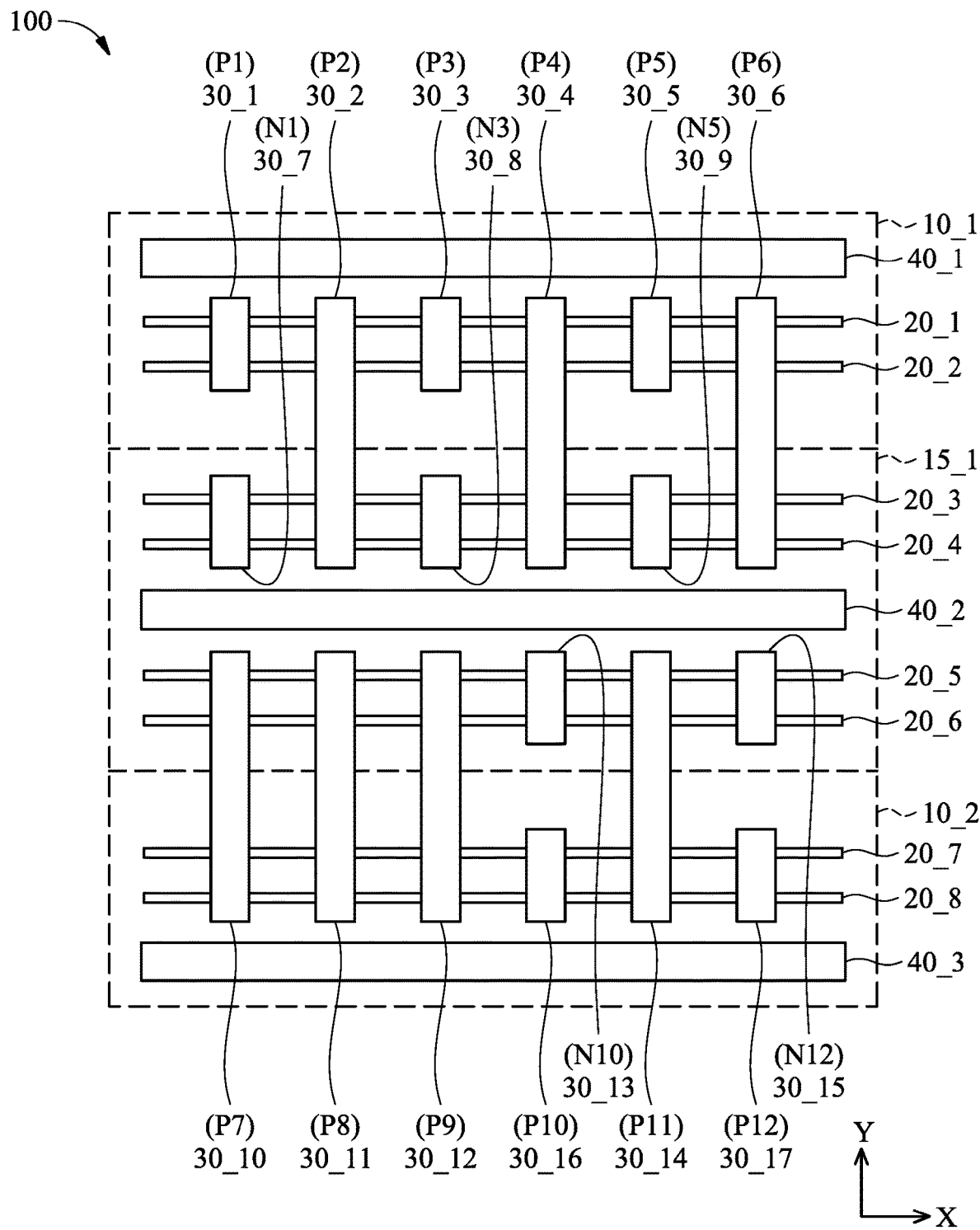

In FIG. 1C, the power rails 40_1 through 40_3 are arranged parallel with the X-direction, and formed in the front end of line (FEOL) process of IC fabrication. Compared with the traditional power rails formed by the metal layers that are formed in the back end of line (BEOL) process of IC fabrication, the power rails 40_1 through 40_3 are buried power rails that are embedded in shallow trench isolation (STI) region. The power rail 40_1 is formed over the N-type well region 10_1, and is configured to electrically connect a positive power supply line (e.g., a VDD line). Similarly, the power rail 40_3 is formed over the N-type well region 10_2, and is configured to electrically connect a positive power supply line (e.g., a VDD line). The power rail 40_2 is formed over the P-type well region 15_1, and is configured to electrically connect a grounding line (e.g., a VSS line).

Figure 1D:
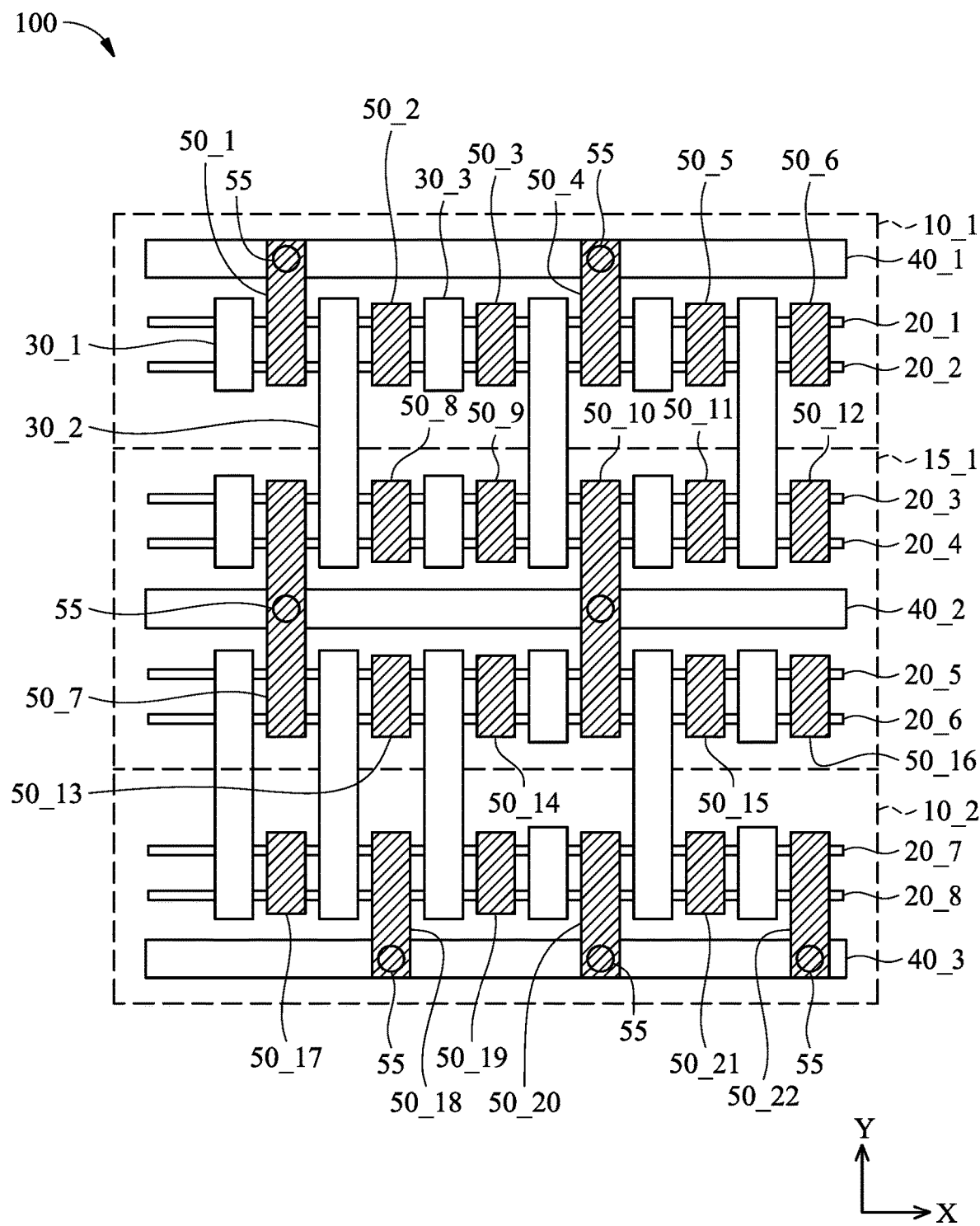

In FIG. 1D, the source/drain contacts 50_1 through 50_22 are arranged parallel with the Y-direction. Each source/drain contact is disposed between two adjacent gate electrodes. Furthermore, each source/drain contact (also referred to as "contact") is capable of connecting the source/drain region of corresponding transistor to the overlying level. For example, the source/drain contact 50_1 is disposed between the gate electrodes 30_1 and 30_2, and the source/drain contact 50_2 is disposed between the gate electrodes 30_2 and 30_3. Thus, the gate electrode 30_2 is disposed between the source/drain contacts 50_1 and 50_2. Therefore, the gate region of the PMOS transistor P2 is coupled to the gate electrode 30_2, and the source region and the drain region are coupled to the source/drain contacts 50_1 and 50_2, respectively.

In FIG. 1D, the source/drain contacts 50_1 and 50_4 are extending above the power rail 40_1 and connecting down to the power rail 40_1 through the lower extension contact 55, thus the source regions of the PMOS transistors P1, P2, P4 and P5 are coupled to the positive power supply line (e.g., a VDD line) through the power rail 40_1 and the corresponding source/drain contact. For example, for the PMOS transistor P1, the source region of the PMOS transistor P1 is coupled to the power rail 40_1 through the source/drain contact 50_1. Similarly, the source/drain contacts 50_18, 50_20 and 50_22 are extending above the power rail 40_3 and connecting down to the power rail 40_3 through the lower extension contact 55, thus the source regions of the PMOS transistors P8 through P12 are coupled to the positive power supply line (e.g., a VDD line) through the power rail 40_3 and the corresponding source/drain contact. Furthermore, the source/drain contacts 50_7 and 50_10 are extending to cross the power rail 40_2 and connecting down to the power rail 40_2 through the lower extension contact 55, thus the source regions of the NMOS transistors N1, N2, N4, N5, N7, N8, N10 and N11 are coupled to a grounding line (e.g., a VSS line) through the power rail 40_2 and the corresponding source/drain contact. For example, for the NMOS transistor N11, the source region of the NMOS transistor N11 is coupled to the power rail 40_2 through the source/drain contact 50_10.

Figure 1E:
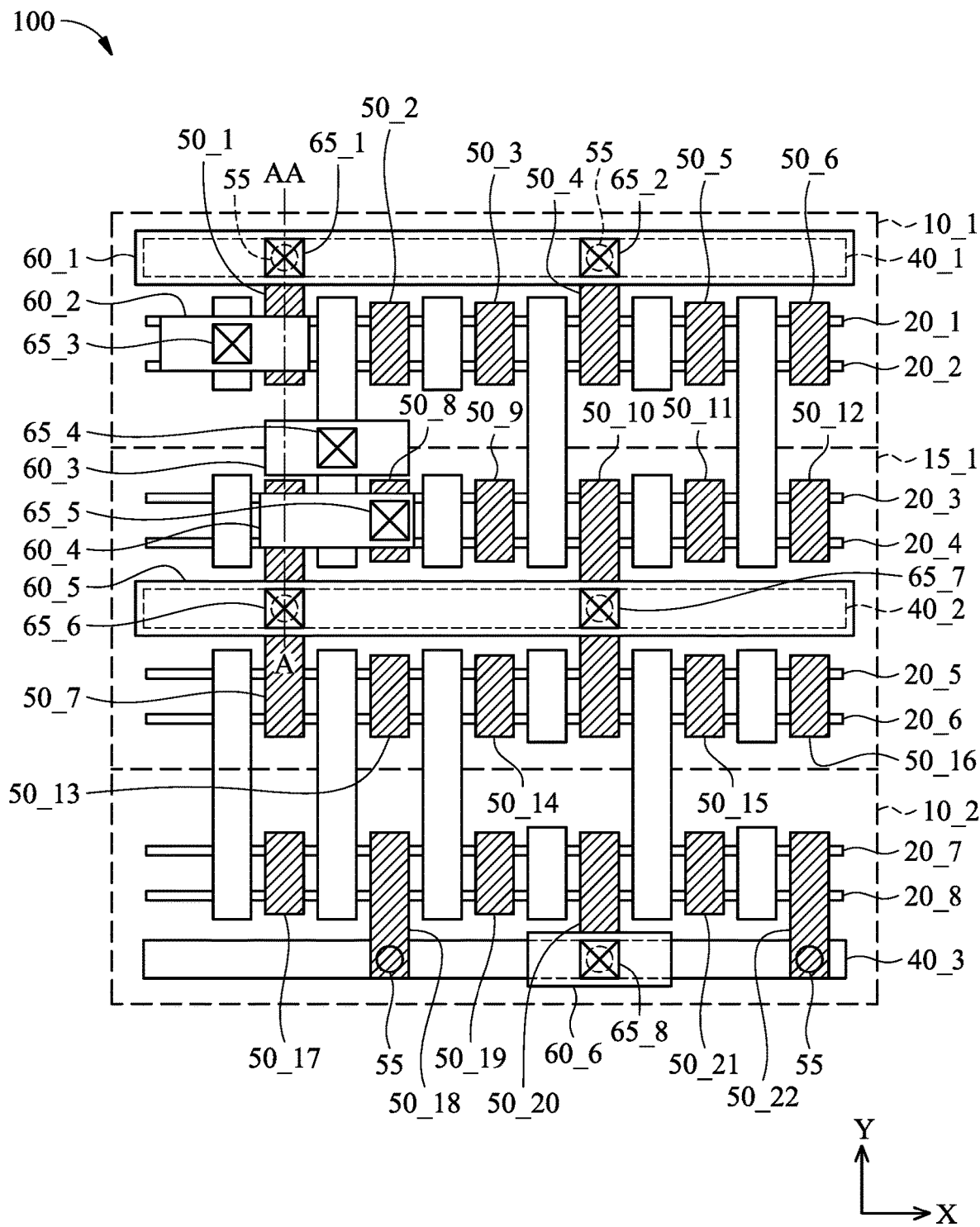

In FIG. 1E, the conductive lines 60_1 through 60_6 are arranged parallel with the X-direction. In order to simplify the description, only the conductive lines 60_1 through 60_6 are shown in FIG. 1E, and other conductive lines are omitted. The conductive line 60_1 is disposed over the power rail 40_1, and the conductive line 60_1 is coupled to the power rail 40_1 through the vias 65_1 and 65_2 and the corresponding source/drain contacts 50_1 and 50_4. Furthermore, the vias 65_1 and 65_2 are disposed over the lower extension contacts 55. The via 65_3 is connected between the gate electrode 30_1 and the conductive line 60_2, which is used to electrically connected the gate region of the PMOS transistor P1 to the conductive line 60_2. The via 65_4 is connected between the gate electrode 30_2 and the conductive line 60_3, which is used to electrically connect the gate region of the PMOS transistor P1 and the NMOS transistor N2 to the conductive line 60_3. The via 65_5 is connected between the source/drain contact 50_8 and the conductive line 60_4, which is used to electrically connected the drain region of the NMOS transistor N2 to the conductive line 60_4. The conductive line 60_5 is disposed over the power rail 40_2, and the conductive line 60_5 is coupled to the power rail 40_2 through the vias 65_6 and 65_7 and the corresponding source/drain contacts 50_7 and 50_10. Furthermore, the vias 65_6 and 65_7 are disposed over the lower extension contacts 55.

In FIG. 1E, the conductive line 60_6 is disposed over the power rail 40_3, and the conductive line 60_6 is electrically connected to the power rail 40_3 through the via 65_8 and the corresponding source/drain contact 50_20. Furthermore, the via 65_8 is disposed over one of the lower extension contacts 55 on the power rail 40_3. In the embodiment, only the via 65_8 is used to connect the conductive line 60_6 to the power rail 40_3. However, the source/drain contacts 50_18 and 50_22 are connected to the power rail 40_3 through the corresponding lower extension contacts 55. Thus, the source/drain contacts 50_18 and 50_22 are also electrically connected to the conductive line 60_6. Furthermore, the conductive line 60_6 and 60_1 are coupled together through the upper conductive lines and the vias between the upper conductive lines over the conductive line 60_6 and 60_1. Due to no via and no conductive line are arranged over the source/drain contacts 50_18 and 50_22, the area over the source/drain contacts 50_18 and 50_22 can be used to provide additional routing area for the signals different from the power lines (e.g., VDD line or VSS line), thereby decreasing layout complexity.

Figure 2:
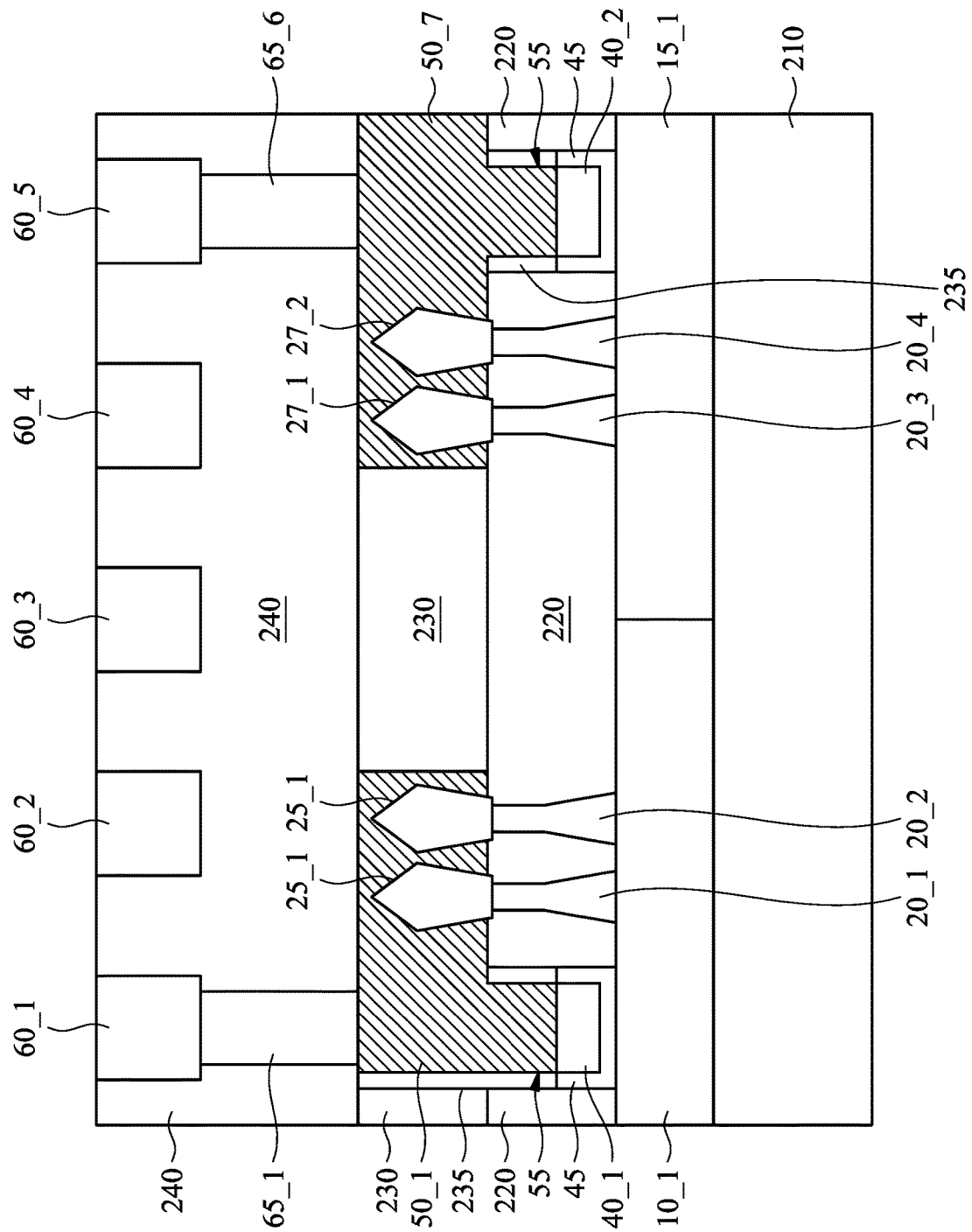
FIG. 2 shows a cross-sectional view of the semiconductor structure along section line AA-A of FIG. 1E according to an embodiment of the invention.

FIG. 2 shows a cross-sectional view of the semiconductor structure 100 along section line AA-A of FIG. 1E according to an embodiment of the invention. The N-type well region 10_1 and the P-type well region 15_1 are formed on a substrate 210. In some embodiments, the substrate 210 is a Si substrate. The fins 20_3 and 20_4 are formed on the P-type well region 15_1. In some embodiments, the fins 20_3 and 20_4 include an appropriate concentration of P-type dopants (e.g., boron (such as 11B), boron, boron fluorine (BF2), or a combination thereof). The fins 20_1 and 20_2 are formed on the N-type well region 10_1. In some embodiments, the fins 20_1 and 20_2 include an appropriate concentration of n-type dopants (e.g., phosphorous (such as 31P), arsenic, or a combination thereof). The fins 20_1 through 20_4 are separated from each other by the shallow trench isolation (STI) region 220.

The power rail 40_1 is formed on the N-type well region 10_1, and the power rail 40_2 is formed on the P-type well region 15_1. The power rails 40_1 and 40_2 are separated from the fins 20_1 through 20_4 by the STI region 220. Furthermore, the power rails 40_1 and 40_2 are separated from the STI region 220, the N-type well region 10_1 and the P-type well region 15_1 by the barrier layer 45.

Inter-Layer Dielectric (ILD) layer 230 is formed over the STI region 220. The ILD layer 230 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The P-type doping regions 25_1 and 25_2 form the source/drain regions on the fins 20_1 and 20_2, and the N-type doping regions 27_1 and 27_2 form the source/drain regions on the fins 20_3 and 20_4. In some embodiments, the material of the N-type doping regions 27_1 and 27_2 includes epitaxy profile. The epitaxy material is selected from a group consisting of SiP content, SiC content, SiPC, SiAs, Si, or combination. Furthermore, the material of the P-type doping regions 25_1 and 25_2 includes epitaxy profile. The epitaxy material is selected from a group consisting of SiGe content, SiGeC content, Ge-content, or combination.

The source/drain contact 50_1 is formed around the P-type doping regions 25_1 and 25_2 corresponding to the fins 20_1 and 20_2. The source/drain contact 50_1 is electrically connected to the power rail 40_1 through the lower extension contact 55. Similarly, the source/drain contact 50_7 is formed around the N-type doping regions 27_1 and 27_2 corresponding to the fins 20_3 and 20_4. In some embodiments, the source/drain contact 50_1 is formed over the P-type doping regions 25_1 and 25_2, and the source/drain contact 50_7 is formed over the N-type doping regions 27_1 and 27_2. The source/drain contact 50_7 is electrically connected to the power rail 40_2 through the lower extension contact 55. The source/drain contacts 50_1 and 50_7 and the corresponding lower extension contacts 55 are separated from the ILD layer 230 and STI region 220 by the blocking layer 235. It should be noted that the N-type doping regions 27_1 and 27_2 and the P-type doping regions 25_1 and 25_2 are formed in the ILD layer 230, and the power rails 40_1 and 40_2 are formed in the STI region 220. Thus, the power rails 40_1 and 40_2 are disposed below the N-type doping regions 27_1 and 27_2 and the P-type doping regions 25_1 and 25_2.

Inter-metallization dielectric (IMD) layer 240 is formed over the ILD layer 230. The vias 65_1 and 65_6 and the conductive lines 60_1 through 60_5 are formed in the IMD layer 240. In some embodiments, the conductive lines 60_1 through 60_5 are metal lines. The source/drain contact 50_1 is electrically connected to the conductive line 60_1 through the via 65_1, thus the conductive line 60_1 over the power rail 40_1 is electrically connected to the power rail 40_1. Similarity, the source/drain contact 50_7 is electrically connected to the conductive line 60_5 through the via 65_6, thus the conductive line 60_5 over the power rail 40_2 is electrically connected to the power rail 40_2.

Embodiments for a semiconductor structure and method for manufacturing the same are provided. FIGS. 3A-3H show cross-sectional representations of various stages of forming a semiconductor structure according to an embodiment of the invention.

Figure 3A:
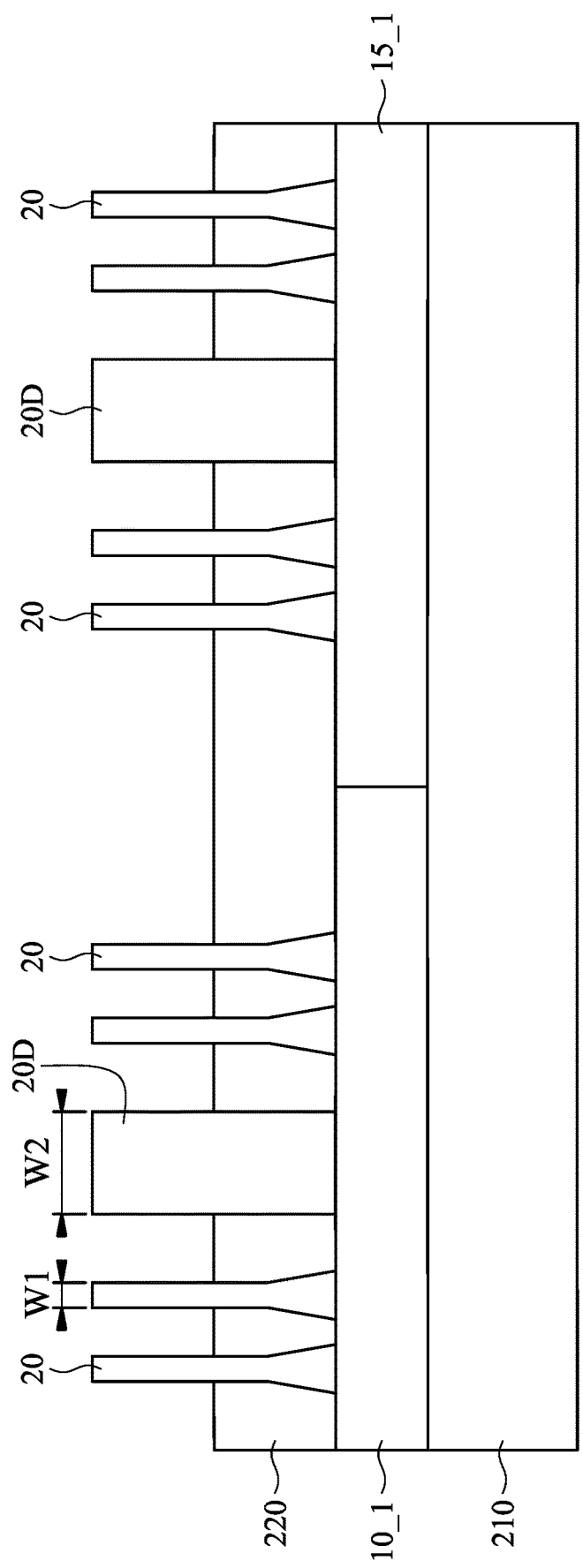
FIGS. 3A-3H show cross-sectional representations of various stages of forming a semiconductor structure according to an embodiment of the invention.

Referring to FIG. 3A, a substrate 210 is provided. The substrate 102 may be made of silicon or other semiconductor materials. In some embodiments, the substrate 102 is a wafer. Next, the N-type well region 10_1 and the P-type well region 15_1 are formed on the substrate 210. In some embodiments, the N-type well region 10_1 may be doped with n-type dopants, such as phosphorus (P) or arsenic (As), and the P-type well region 15_1 may be doped with p-type dopants, such as boron or $BF_2$. Next, a plurality of fins 20 and a plurality of dummy fins 20D are formed over the N-type well region 10_1 and the P-type well region 15_1. Furthermore, the STI region 220 is formed over the N-type well region 10_1 and the P-type well region 15_1. The STI region 220 is an isolation structure that is used to define and electrically isolate the fins 20 and the dummy fins 20D. It should be noted that the dummy fin 20D is wider than the fin 20, i.e., W2>W1. Furthermore, each fin 20 is used to form a transistor in the semiconductor structure, and each dummy fin 20D is used to form a power rail embedded in the STI region 220.

Figure 3B:
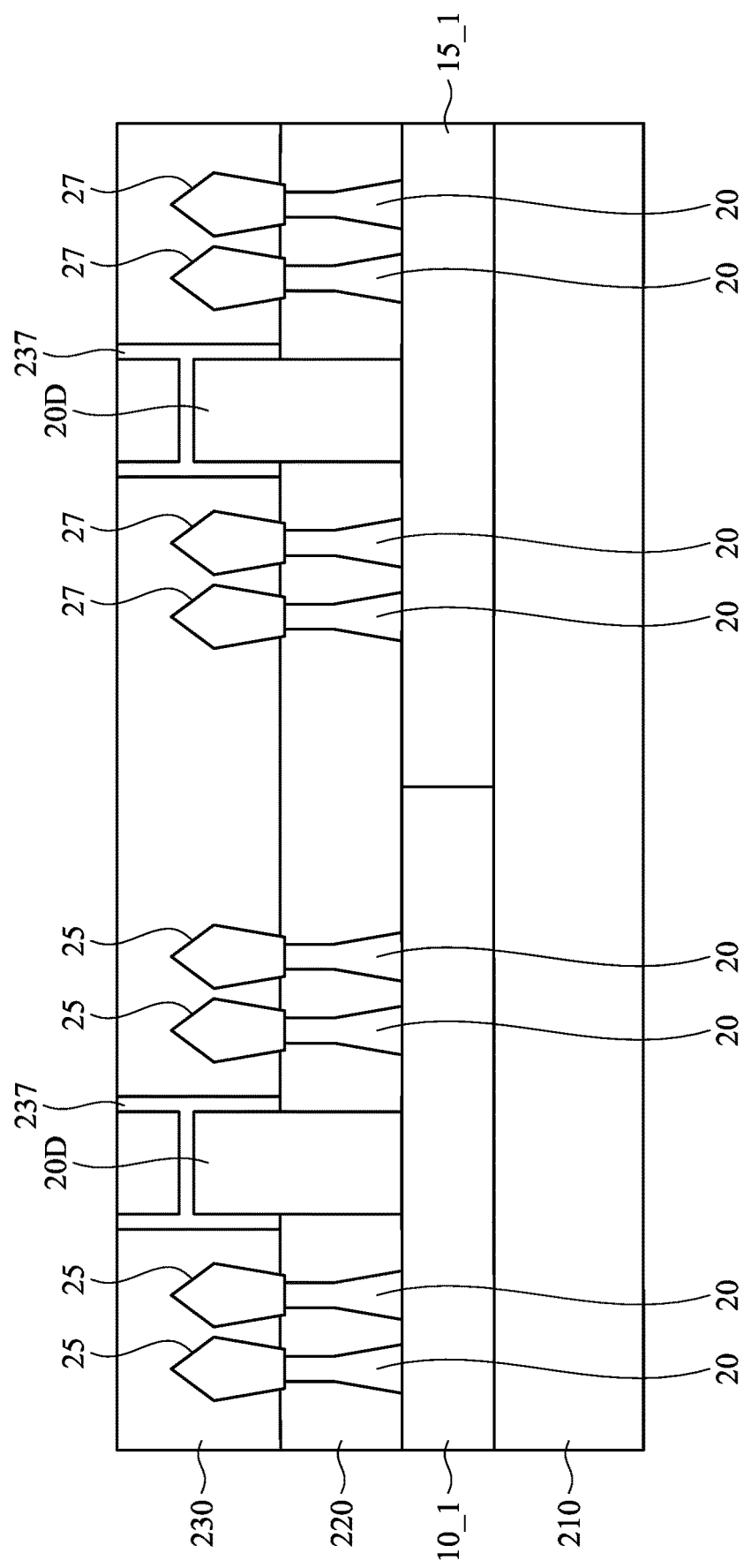

As shown in FIG. 3B, an ILD planarization is completed on the semiconductor structure. The P-type doping regions 25 are formed on the fins 20 over the N-type well region 10_1. Furthermore, the N-type doping regions 27 are formed on the fins 20 over the P-type well region 15_1. The ILD layer 230 is formed over the STI region 220. A spacer 237 is formed between the dummy fin 20D and the ILD layer 230.

Figure 3C:
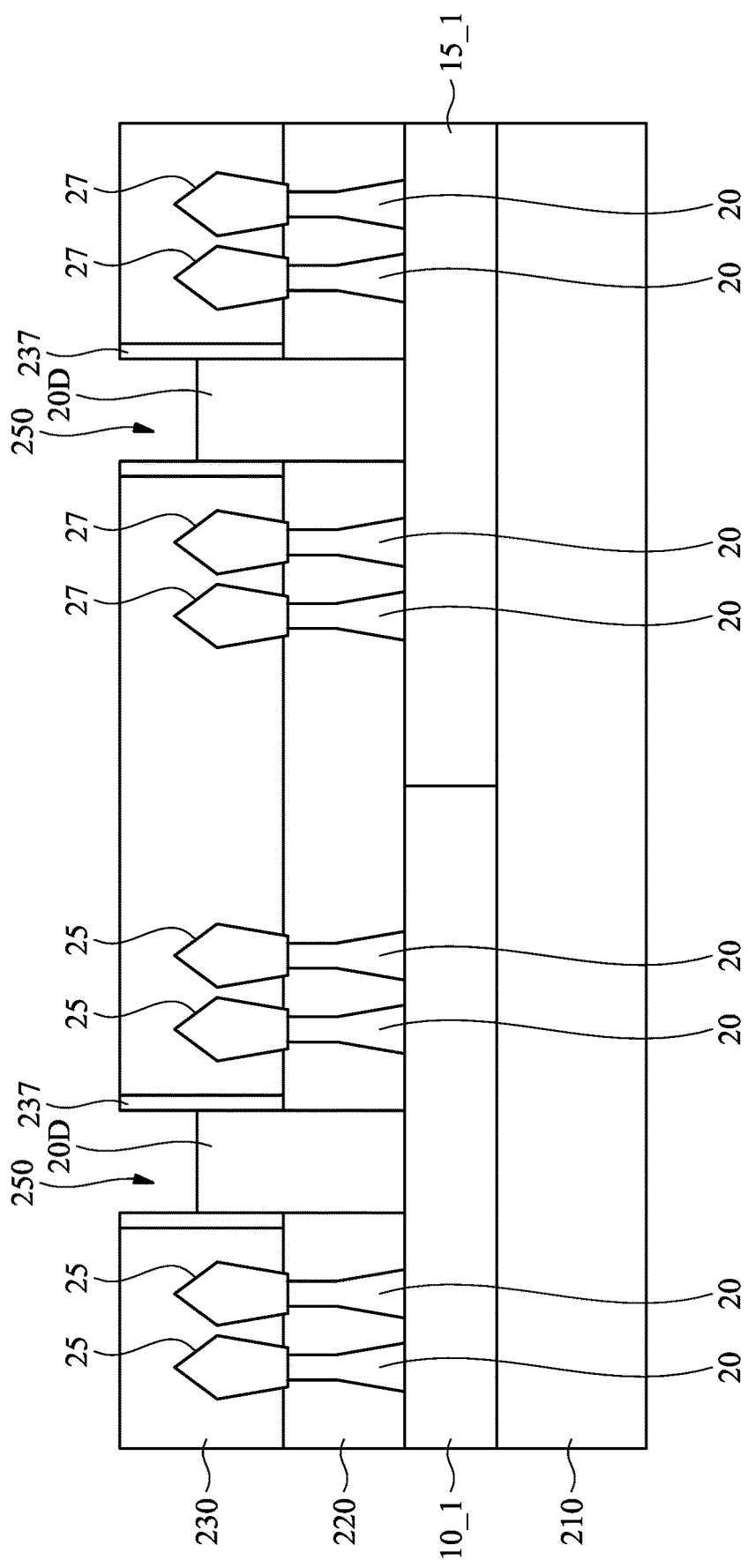

In FIG. 3C, a plurality of openings 250 of the ILD layer 230 are formed above the dummy fins 20D. Furthermore, the spacer 237 and the ILD layer 230 over each dummy fin 20D are removed.

Figure 3D:
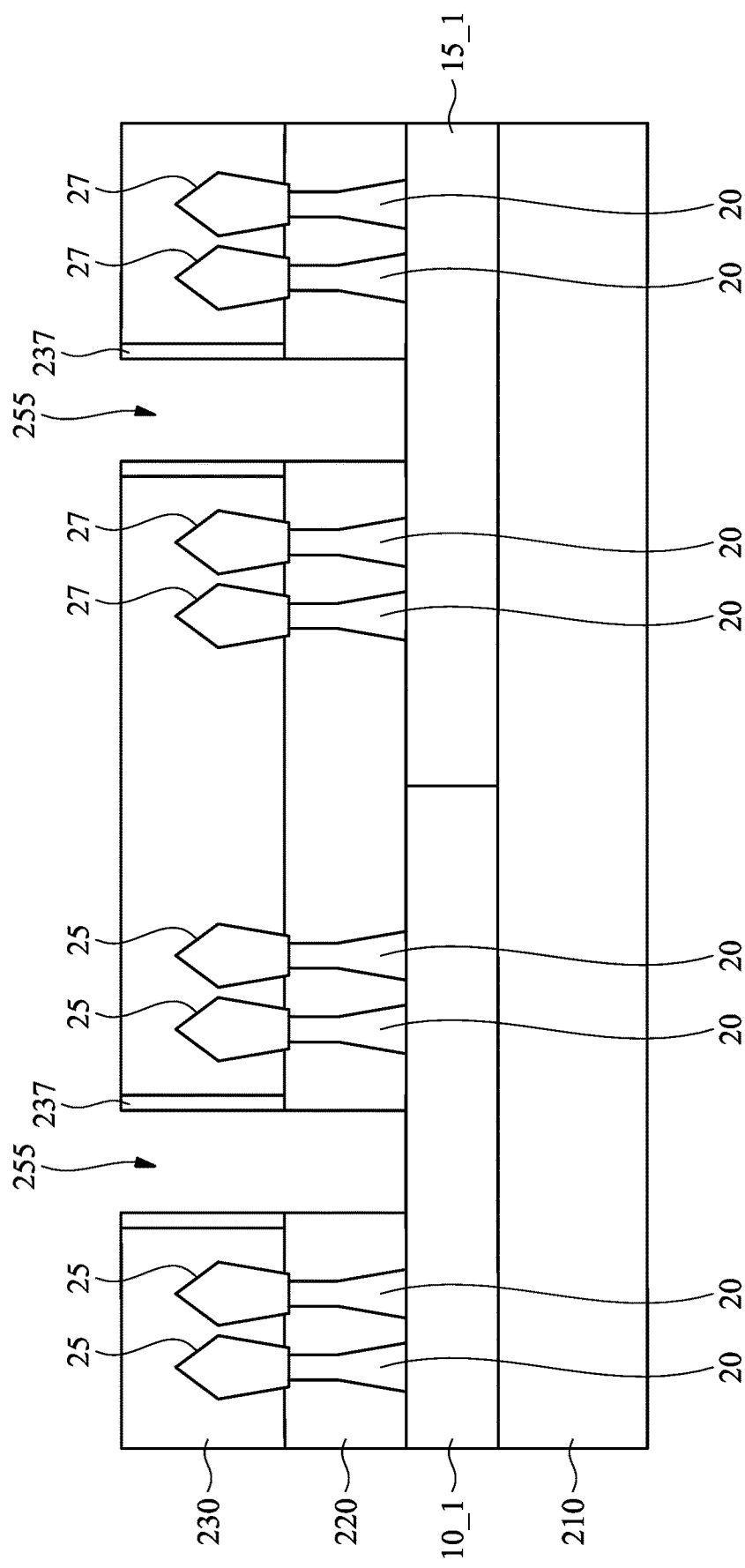

In FIG. 3D, a wet etching process is performed on the semiconductor structure, so as to remove the dummy fins 20D over the N-type well region 10_1 and the P-type well region 15_1 through the openings 250. Thus, the trenches 255 are formed over the N-type well region 10_1 and the P-type well region 15_1.

Figure 3E:
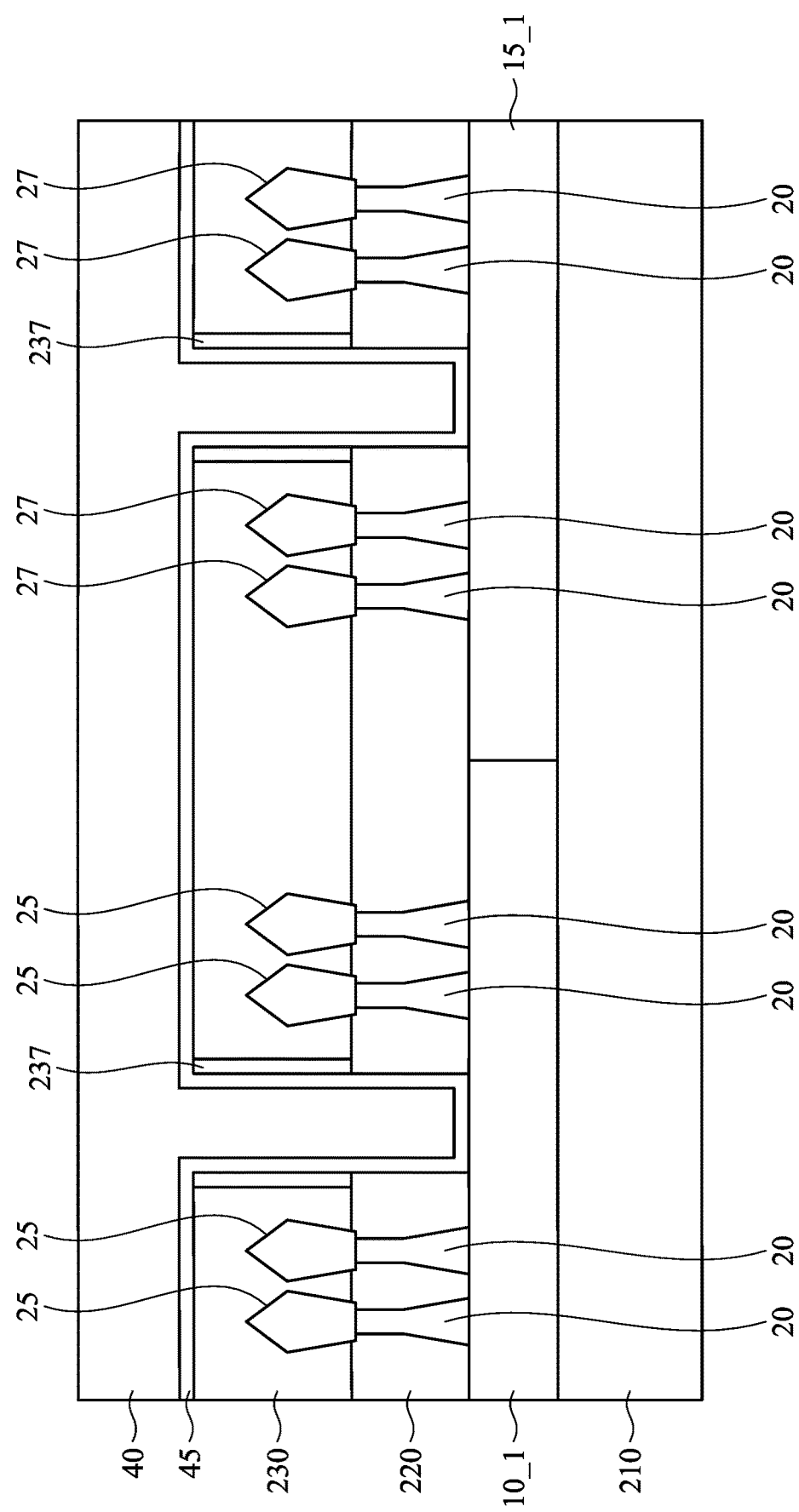

In FIG. 3E, the barrier layer 45 and the conducting layer 40 are filled up the trenches 255. The barrier layer 45 protects the underlying N-type well region 10_1 and P-type well region 15_1 from contacting the conducting material of the conducting layer 40 when the conducting layer 40 is later formed.

Figure 3F:
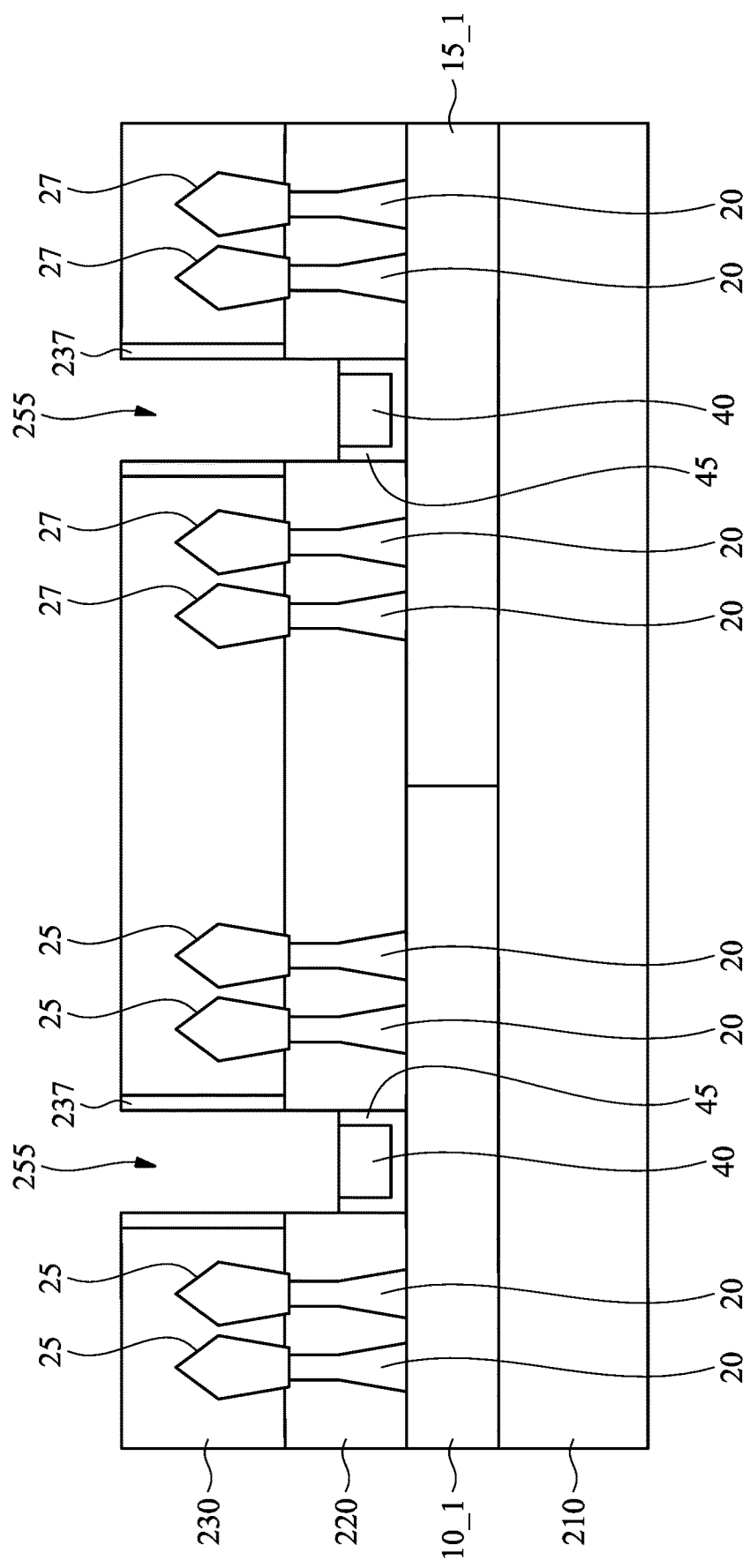

In FIG. 3F, a chemical-mechanical planarization (CMP) is performed on the conducting layer 40, and then the conducting layer 40 in the trench 255 is recessed to a specific height. Thus, the remaining conducting layer 40 in the trench 255 forms the power rail (e.g., 40_1 and 40_2 of FIG. 2) in the STI region 220. Furthermore, the specific height of the power rail 40 is less than that of the fins 20. In some embodiments, the specific height of the power rail 40 is below the P-type doping regions 25_1 and 25_2 and the N-type doping regions 27_1 and 27_2.

Figure 3G:
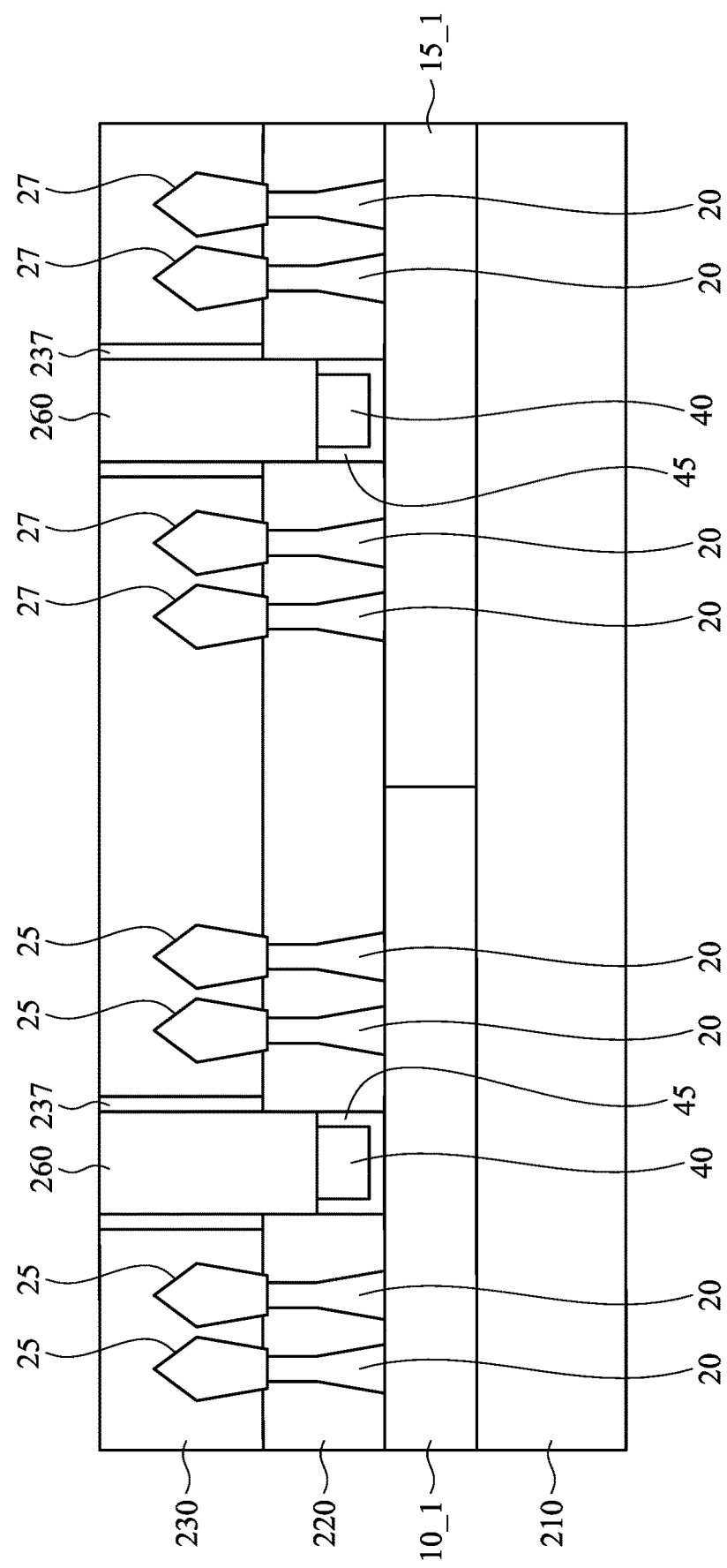

In FIG. 3G, a deposition process is performed to form the hard mask 260 over the power rail 40. Next, the subsequent processes before a middle-of-line (MoL) process are performed. For example, a replacement metal gate (RMG) is performed on the gate electrodes of the semiconductor structure.

Figure 3H:
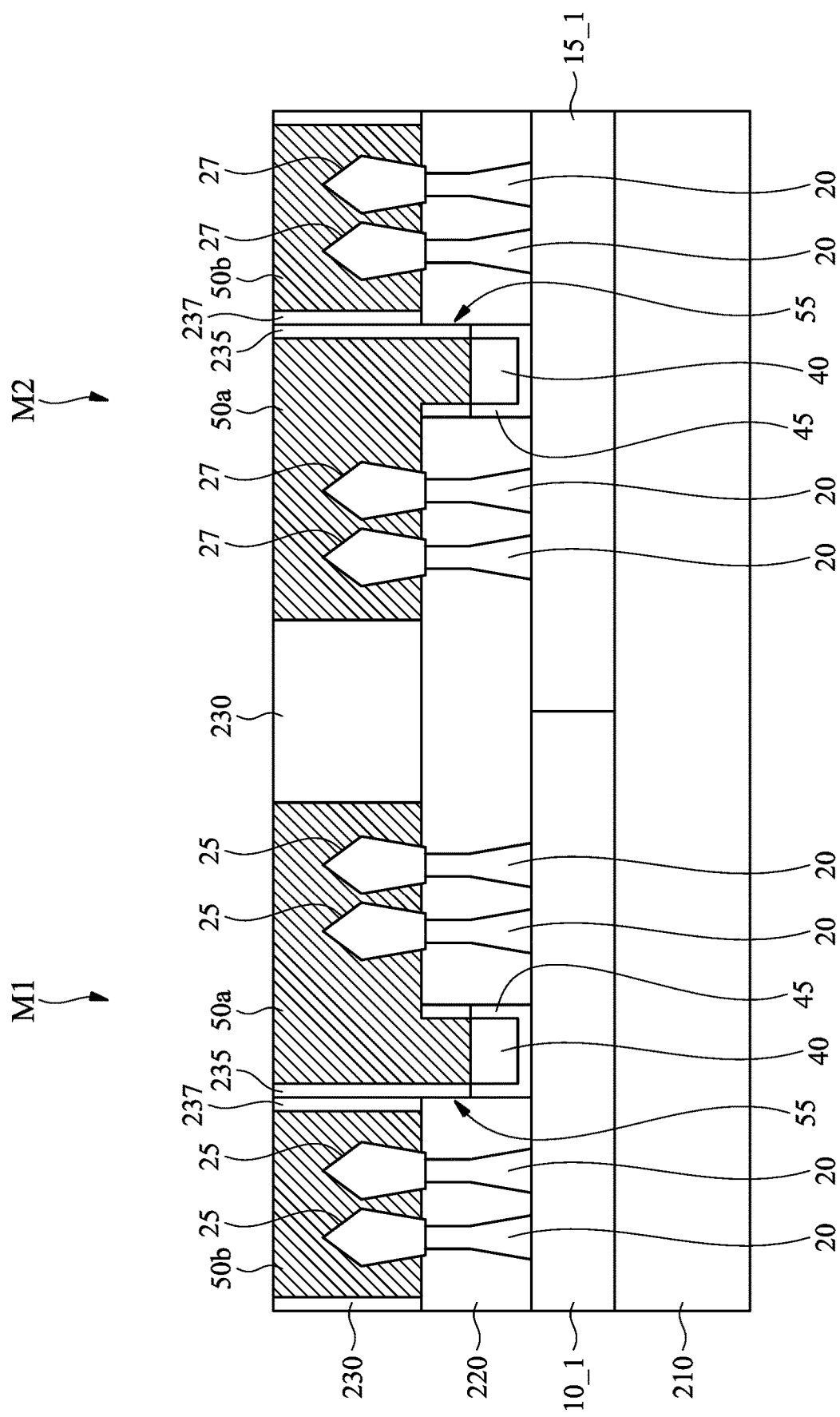

In FIG. 3H, the source/drain contacts 50a/50b are formed around the P-type doping regions 25 and the N-type doping regions 27. In the embodiment, each source/drain contact 50a/50b is coupled to the source/drain region of a transistor comprising a dual-fin structure. In the embodiment, each source/drain contact 50a is connecting down to the adjacent power rail 40 through the corresponding lower extension contact 55. For example, for the PMOS transistor M1 over the N-type well region 10_1, the source/drain contact 50a is configured to connect the source region of the PMOS transistor M1 (i.e., the P-type doping region 25 on the right). Thus, the source region of the PMOS transistor M1 is electrically connected to the power rail 40 over the N-type well region 10_1 through the source/drain contact 50a and the corresponding lower extension contact 55. Furthermore, the N-type well region 10_1 is also electrically connected to the power rail 40. In some embodiments, the power rail 40 over the N-type well region 10_1 and the N-type well region 10_1 are coupled to the positive power supply line (e.g., a VDD line). Similarly, for the NMOS transistor M2 over the P-type well region 15_1, the source/drain contact 50a is configured to connect the source region of the NMOS transistor M2. Thus, the source region of the NMOS transistor M2 is electrically connected to the power rail 40 over the P-type well region 15_1 through the source/drain contact 50a and the corresponding lower extension contact 55. Furthermore, the P-type well region 15_1 is also electrically connected to the power rail 40. In some embodiments, the power rail 40 over the P-type well region 15_1 and the P-type well region 15_1 are coupled to a grounding line (e.g., a VSS line).

According to the embodiments, by using the dummy fin to form the power rails in the STI, a greater area over the source/drain contacts that connect to the embedded power rails can be used for routing the signals other than the power rails for layout, thereby decreasing the routing complexity and speed up the design of the IC.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a shallow trench isolation (STI) region on a well region of a substrate;
   a plurality of transistors, each comprising:
      at least one fin formed on the well region, and extending in a first direction;
      a gate electrode formed on the at least one fin and extending in a second direction that is perpendicular to the first direction; and
      a doping region formed on the at least one fin; and
   a power rail formed in the STI region and below the doping regions of the plurality of transistors, and extending in the first direction;
   wherein each of the doping regions is electrically connected to the power rail, so as to form a source region of a respective transistor, and the power rail is electrically connected to the well region of the substrate,
   wherein a bottom-most surface of the power rail is over a top-most surface of the well region,
   wherein the power rail is electrically coupled to VDD or VSS.

2. The semiconductor structure as claimed in claim 1, wherein each transistor of the plurality of transistors further comprises:
   a source contact extending from the doping region to the power rail,
   wherein the doping region is electrically connected to the power rail through the source contact.

3. The semiconductor structure as claimed in claim 1, wherein a transistor of the plurality of transistors is an NMOS transistor, and the power rail is electrically coupled to VSS.

4. The semiconductor structure as claimed in claim 3, wherein the well region is a P-type well region, and the doping region is an N-type doping region.

5. The semiconductor structure as claimed in claim 1, wherein a transistor of the plurality of transistors is a PMOS transistor, and the power rail is electrical coupled to VDD.

6. The semiconductor structure as claimed in claim 5, wherein the well region is an N-type well region, and the doping region is a P-type doping region.

7. The semiconductor structure as claimed in claim 1, further comprising:
   a barrier layer formed between the power rail and the well region.

8. The semiconductor structure of claim 1, wherein a top surface of the power rail is below a bottom surface of doping regions.

9. An integrated circuit, comprising:
   a substrate;
   an N-type well region on the substrate;
   a P-type well region on the substrate;
   a shallow trench isolation (STI) region on the P-type well region and the N-type well region;
   an interlayer dielectric (ILD) layer over the STI region;
   a plurality of cells, each comprising: at least one PMOS transistor formed over the N-type well region; and
   at least one NMOS transistor formed over the P-type well region, wherein the at least one PMOS transistor is separated from the at least one NMOS transistor by the STI region and the ILD layer;

a VDD line formed in the STI region over the N-type well region and under the ILD layer, and electrically connected to a source region of the at least one PMOS transistor; and a VSS line formed in the STI region over the P-type well region and under the ILD layer, and electrically connected to a source region of the at least one PMOS transistor, wherein a bottom-most surface of the VDD line is over a top-most surface of the N-type well region, and a bottom-most surface of the VSS line is over a top-most surface of the P-type well regions wherein the VDD line is below the source region of the at least one PMOS transistor, wherein the VDD line is electrically connected to VDD and the VSS line is electrically connected to VSS.

10. The integrated circuit as claimed in claim 9, wherein the at least one PMOS transistor comprises:

at least one first fin formed on the N-type well region, and extending in a first direction;

a first gate electrode formed on the at least one first fin and extending in a second direction that is perpendicular to the first direction; and a P-type doping region on the at least one first fin and separated from the first gate electrode, wherein the VDD line is formed over the N-type well region and below the P-type doping region.

11. The integrated circuit as claimed in claim 10, wherein the at least one PMOS transistor further comprises:

a first source contact extending from respective P-type doping region to the VDD line, so as to electrically connect the VDD line and the respective P-type doping region.

12. The integrated circuit as claimed in claim 10, wherein the at least one NMOS transistor comprises:

at least one second fin formed on the P-type well region, and extending in the first direction;

a second gate electrode formed on the at least one second fin and extending in the second direction; and an N-type doping region on the at least one second fin and separated from the second gate electrode, wherein the VSS line is formed over the P-type well region and below the N-type doping region.

13. The integrated circuit as claimed in claim 12, wherein the at least one NMOS transistor further comprises:

a second source contact extending from a respective N-type doping region to the VSS line, so as to electrically connect the VSS line and the respective N-type doping region.

14. The integrated circuit as claimed in claim 12, wherein the VDD line and VSS line are parallel with the at least one first and at least one second fins, and the plurality of cells are arranged in a row between the VDD line and the VSS line.

15. The integrated circuit as claimed in claim 9, wherein the plurality of cells comprise standard cells or memory cells.

16. The integrated circuit as claimed in claim 9, further comprising:

a first barrier layer formed between the VDD line and the N-type well region; and a second barrier layer formed between the VSS line and the P-type well region.

17. The integrated circuit of claim 9, wherein a top surface of the VDD line is below a bottom surface of the source region of the at least one PMOS transistor.

* * * * *